United States Patent
Yamaguchi et al.

(10) Patent No.: US 6,613,608 B1
(45) Date of Patent: Sep. 2, 2003

(54) SEMICONDUCTOR WAFER WITH ANISOTROPIC CONDUCTOR FILM, AND METHOD OF MANUFACTURE THEREOF

(75) Inventors: Miho Yamaguchi, Ibaraki (JP); Yuji Hotta, Ibaraki (JP); Fumiteru Asai, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/070,637

(22) PCT Filed: Aug. 24, 2000

(86) PCT No.: PCT/JP00/05730

§ 371 (c)(1),
(2), (4) Date: Jul. 12, 2000

(87) PCT Pub. No.: WO01/20661

PCT Pub. Date: Mar. 22, 2001

(30) Foreign Application Priority Data

Sep. 10, 1999 (JP) ............................................. 11-258059
Oct. 6, 1999 (JP) ............................................. 11-285150

(51) Int. Cl.[7] ................................................. H01L 21/44
(52) U.S. Cl. ....................... 438/119; 438/118; 438/124; 438/126; 438/127; 257/787; 257/788; 257/795
(58) Field of Search ........................... 438/119, 118, 438/108, 111, 112, 123, 124, 125, 126, 127; 257/787, 788, 789, 790, 798

(56) References Cited

U.S. PATENT DOCUMENTS

| | | | | |
|---|---|---|---|---|
| 5,354,714 A | * | 10/1994 | Boysel | 438/127 |
| 6,210,994 B1 | * | 4/2001 | Calegari et al. | 438/127 |
| 6,365,432 B1 | * | 4/2002 | Fukutomi et al. | 438/127 |
| 6,417,026 B2 | * | 7/2002 | Gotoh et al. | 438/119 |
| 6,486,001 B1 | * | 11/2002 | Ohshima et al. | 438/119 |
| 6,486,004 B1 | * | 11/2002 | Wensel | 438/118 |

FOREIGN PATENT DOCUMENTS

JP          2000-195903          7/2000

* cited by examiner

*Primary Examiner*—Kevin M. Picardat
(74) *Attorney, Agent, or Firm*—Sughrue Mion, PLLC

(57) ABSTRACT

An anisotropic conductive film 2 is superimposed on a circuit face 1a of a semiconductor wafer 1, and sandwiched and depressurizably surrounded with a flexible film 3 and a rigid plate 4 (or two flexible films) in the laminating direction, followed by depressurization of the surrounded interior by pressurizing at least in the laminating direction and heating the laminate as is from the outside, thereby joining the semiconductor wafer and the anisotropic conductive film, to produce a semiconductor wafer with an anisotropic conductive film. By forming an inhibiting layer on the rear face of a semiconductor wafer, the inhibiting layer warps in the direction antagonizing an expansion-shrinkage force produced on the anisotropic conductive film, and the warping of the entirety can be inhibited.

14 Claims, 11 Drawing Sheets

SEMICONDUCTOR WAFER WITH ANISOTROPIC CONDUCTOR FILM, AND METHOD OF MANUFACTURE THEREOF

TECHNICAL FIELD OF THE INVENTION

The present invention relates to a technique for applying an anisotropic conductive film to a semiconductor wafer.

BACKGROUND OF THE INVENTION

An anisotropic conductive film (hereinafter to be also referred to as "ACF") is a film showing anisotropic conductivity, which shows conductivity in the direction penetrating the front and back of the film and insulation property in the direction of expansion of a film plane. Therefore, by inserting ACF between bare semiconductor element (chip) diced from a wafer and an external circuit board and pressing these three members against each other, electrodes formed on a circuit face of the chip and an external circuit board are electrically connected. The external circuit board is exemplified by a chip-packaging substrate, a typical printed circuit board for co-mounting a chip with other devises, and the like. The use of ACF for mounting a chip has been increasing to meet the recent move toward large-scale integration of semiconductor integrated circuits and fine-pitched connecting terminals (e.g., electrode pad).

Conventionally-known ACFs are formed by dispersing conductive microparticles in a film made of an adhesive insulating material. However, this type of ACF poses structure-related problems, including difficulty in fine pitch connection with the connection target and necessity for a convex (bumpy) electrode on a chip.

To solve these problems, JP-A-3-266306 entitled "ANISOTROPIC CONDUCTIVE FILM" and WO98/07216 entitled "ANISOTROPIC CONDUCTIVE FILM AND METHOD FOR MANUFACTURING SAME" propose ACF having a different and new structure. This ACF has a structure wherein a number of conductive paths insulated from each other penetrate a film substrate and both ends of each conductive path are exposed on the front and back faces of the film substrate. This structure solves the above-mentioned problems of fine pitch structure and the shape of electrodes on a chip.

The present inventors further studied the connection between a chip and an external circuit board via the above-mentioned ACF, and now found the following problems.

A first problem is that simultaneous junction of a chip, ACF and an external circuit board in the mounting process does not allow large-scale production.

To solve this problem, the present invention proposes earlier junction of ACF with either a chip or an external circuit board.

However, junction of ACF with a chip according to this method still poses a problem in achieving junction of the two at a large scale and at a sufficiently high throughput (amount to be processed in a given time). In particular, junction of ACF with microsized chips having a size of not more than 5 mm×5 mm, among others, not more than 3 mm×3 mm, defies increase in throughput due to the need of fine and precise alignment for adhesion of ACF to each chip.

To solve this problem, the present invention further proposes earlier adhesion of a large sheet of ACF to a semiconductor wafer before dicing into chips, followed by dicing into each chip. By this method, the throughput can be increased sufficiently.

When the present inventors actually adhered an ACF to a semiconductor wafer for junction, however, air voids often remained between the semiconductor wafer and the ACF during superposition, because the both have large areas. The air voids form voids in the junction part. When a thermal cycle is applied thereto, or upon moisture absorption or temperature rise, peeling proceeds and degrades the connection reliability. Even if the aforementioned problem of voids is resolved, a throughput affording a high level of production amount while retaining the quality in terms of connection reliability between them can be secured only when a new method of efficiently joining the both after superposition by heating while applying a contact load according to an appropriate method. Otherwise, a decrease in the throughput due to cracking of a wafer cannot be prevented.

On the other hand, a laminate of a semiconductor wafer and ACF sometimes warps and, in an extreme case, wafer is cracked, during heating for joining these two members or cooling after joining, due to a great difference in the coefficient of linear expansion between them. When, for example, a semiconductor wafer and ACF are joined after heating to allow junction upon sufficient thermal expansion, it warps in the direction of an arrow as shown in FIG. 10, due to greater shrinkage of ACF upon cooling.

SUMMARY OF THE INVENTION

It is therefore an object of the present invention to solve the above-mentioned problems and provide a method for efficiently producing an ACF-semiconductor wafer joined product while retaining fine quality.

Another object of the present invention is to solve the above-mentioned problems and provide an ACF-semiconductor wafer joined product as a structure free of warp.

The present invention is characterized by the following.

(1) A method for producing a semiconductor wafer with an anisotropic conductive film, which method comprises the steps of sandwiching and depressurizably surrounding a laminate of an anisotropic conductive film on a circuit face of a semiconductor wafer, with flexible films or with a flexible film and a rigid plate, in the laminating direction, depressurizing the surrounded interior, and joining the semiconductor wafer and the anisotropic conductive film by pressurization of the laminate at least in the laminating direction and heating as is from the outside.

(2) The production method of the above-mentioned (1), wherein the above-mentioned anisotropic conductive film has a structure comprising a plurality of metal conductor wires as conductive paths, which are insulated from each other, and which penetrate a film substrate made of an insulating resin in the thickness direction thereof, and wherein the insulating resin to be used for the film substrate is a material that acquires adhesion property by heating.

(3) The production method of the above-mentioned (2), wherein the conductive path of the above-mentioned anisotropic conductive film has a solder layer on at least one of the both ends thereof.

(4) The production method of the above-mentioned (1), wherein the above-mentioned laminate is sandwiched with flexible films or with a flexible film and a rigid plate in the laminating direction, via a release layer.

(5) The production method of the above-mentioned (4), wherein the release layer has a thickness of 25 μm–250 μm.

(6) The production method of the above-mentioned (1) or (4), wherein the above-mentioned laminate is sandwiched in the laminating direction with a flexible film and a rigid plate, and a cushion layer is inserted between the laminate and the rigid plate.

(7) The production method of the above-mentioned (1), wherein the semiconductor wafer and the anisotropic conductive film are joined by pressurization of the laminate at least in the laminating direction and heating as is from the outside, the external pressurization is released first and then the temperature is lowered.

(8) A semiconductor wafer with an anisotropic conductive film, comprising an anisotropic conductive film joined on a circuit face of the semiconductor wafer, and an inhibiting layer on a rear face of the semiconductor wafer, which layer causes an expansion-shrinkage force due to the aforementioned temperature change by antagonizing an expansion-shrinkage force generated on the aforementioned anisotropic conductive film due to temperature changes such that the entire film is kept from warping.

(9) The semiconductor wafer with an anisotropic conductive film of the above-mentioned (8), wherein the above-mentioned anisotropic conductive film has a structure comprising a plurality of metal conductor wires as conductive paths, which are insulated from each other, and which penetrate a film substrate made of an insulating resin in the thickness direction thereof, and wherein the insulating resin to be used for the film substrate is a material that acquires adhesion property by heating.

(10) The semiconductor wafer with an anisotropic conductive film of the above-mentioned (9), wherein the conductive path of the above-mentioned anisotropic conductive film has a solder layer on at least an outer end of the both ends thereof.

(11) The semiconductor wafer with an anisotropic conductive film of the above-mentioned (8), wherein the above-mentioned inhibiting layer is made from an organic polymer material.

(12) The semiconductor wafer with an anisotropic conductive film of the above-mentioned (8), wherein the above-mentioned anisotropic conductive film has a $(\alpha1 \times E1 \times t1)/(\alpha2 \times E2 \times t2)$ ratio of a product $(\alpha1 \times E1 \times t1)$ of (a coefficient of linear expansion $\alpha1$, an elastic modulus $E1$ and a thickness $t1$) of the above-mentioned anisotropic conductive film to a product $(\alpha2 \times E2 \times t2)$ of (a coefficient of linear expansion $\alpha2$, an elastic modulus $E2$ and a thickness $t2$) of the above-mentioned inhibiting layer of 0.5–2.0.

(13) The semiconductor wafer with an anisotropic conductive film of the above-mentioned (8), wherein the above-mentioned inhibiting layer comprises a coloring agent.

(14) A method for producing a semiconductor wafer with an anisotropic conductive film of any of the above-mentioned (8)–(13), which method comprises the steps of superimposing an anisotropic conductive film on a circuit face of a semiconductor wafer, superimposing an inhibiting layer on a rear face of the semiconductor wafer, which layer causes an expansion-shrinkage force due to the aforementioned temperature change by antagonizing an expansion-shrinkage force generated on the aforementioned anisotropic conductive film due to temperature changes such that the entire film is kept from warping, and joining these successively or simultaneously with a semiconductor wafer by heating and/or pressurizing such that respective expansion-shrinkage forces antagonize with each other to inhibit warping.

(15) The production method of the above-mentioned (14), which method comprises the steps of superimposing an anisotropic conductive film on a circuit face of a semiconductor wafer, superimposing an inhibiting layer on the rear face of the semiconductor wafer, sandwiching and depressurizably surrounding this with flexible films or with a flexible film and a rigid plate in the laminating direction, depressurizing the surrounded interior, and pressurizing the surrounded interior at least in the laminating direction and heating the surrounded interior as is from the outside, to join the semiconductor wafer with the anisotropic conductive film and the semiconductor wafer with the inhibiting layer.

The semiconductor wafer with an anisotropic conductive film is explained by also referring to as a "wafer with ACF" in the following.

BRIEF DESCRIPTION OF THE DRAWING

FIG. 5a shows a top view. FIG. 5b shows a section along X—X in FIG. 5a. For convenient explanation, a suction hole H that does not appear in this section is additionally shown.

DETAILED DESCRIPTION OF THE INVENTION

As used in the present invention, the "semiconductor wafer" refers to a plate comprising a wafer (crystal substrate) and one or more element structures. The element structure is a kind of circuit consisting of a semiconductor crystal layer and an electrode, which is exemplified by a simple structure such as a light emitting element, a processor integrating CPU, memory and various arithmetic circuits, and the like. The element structure is generally repeat formed in a great number on a wafer in a matrix state and finally diced into each chip. It may be formed as one large element on a wafer without dicing into chips. The wafer may be a crystal substrate capable of growing a semiconductor crystal layer, such as a semiconductor crystal (e.g., Si, GaAs and the like), a sapphire crystal to grow a GaN-based semiconductor, and the like. In this specification, the surface, on which an element structure is formed, is referred to as a "circuit face" and the opposite surface as a "rear face", thereby distinguishing the both surfaces of a semiconductor wafer.

The production method of the above-mentioned (1) is explained first by referring to an embodiment using a flexible film and a rigid plate. An embodiment using a flexible film alone will be explained where necessary.

The production method of the present invention includes the following steps (i) and (ii).

Figure 1A:
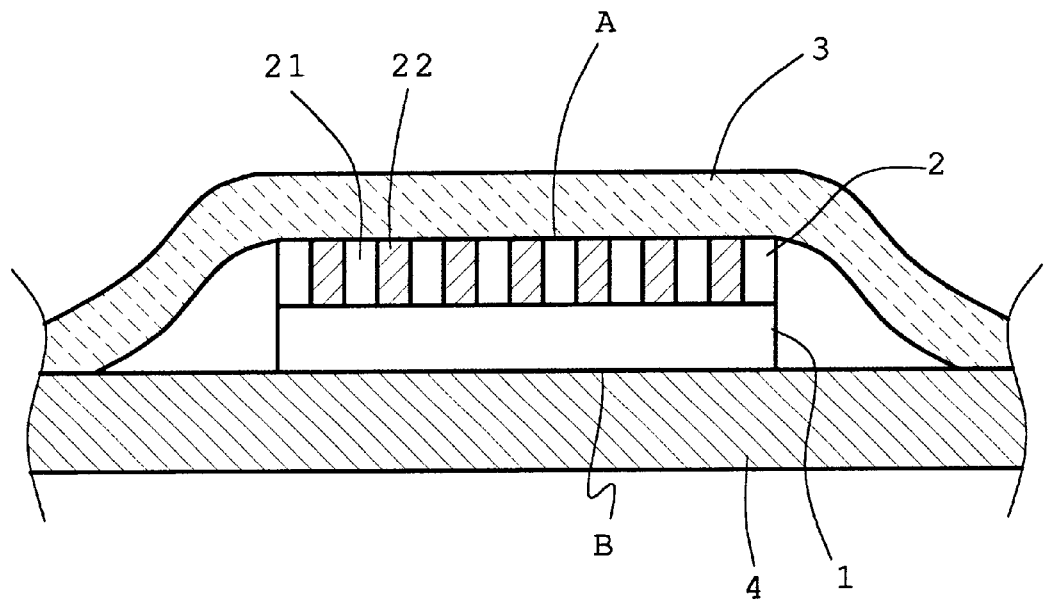
FIG. 1a and FIG. 1b are sectional views showing the production method of the above-mentioned (1) of the present invention, in which a wafer with ACF is being processed. These Figures show an embodiment using a film and a rigid plate, wherein the detailed inner structure of a semiconductor wafer 1 has been omitted. For easy explanation, the thickness of the conductive path in the ACF and the longitudinal and horizontal dimensional ratios have been changed for exaggeration, and hatching is used for demarcation.

(i) As shown in FIG. 1a, ACF 2 is layered on a circuit face (upper face in the Figure) of a semiconductor wafer 1. This layered product (hereinafter laminate article) may be merely layered or temporarily tacked. This laminate article is sandwiched in the laminating direction between a flexible film 3 and a rigid plate 4 and depressurizably surrounded.

Figure 1B:
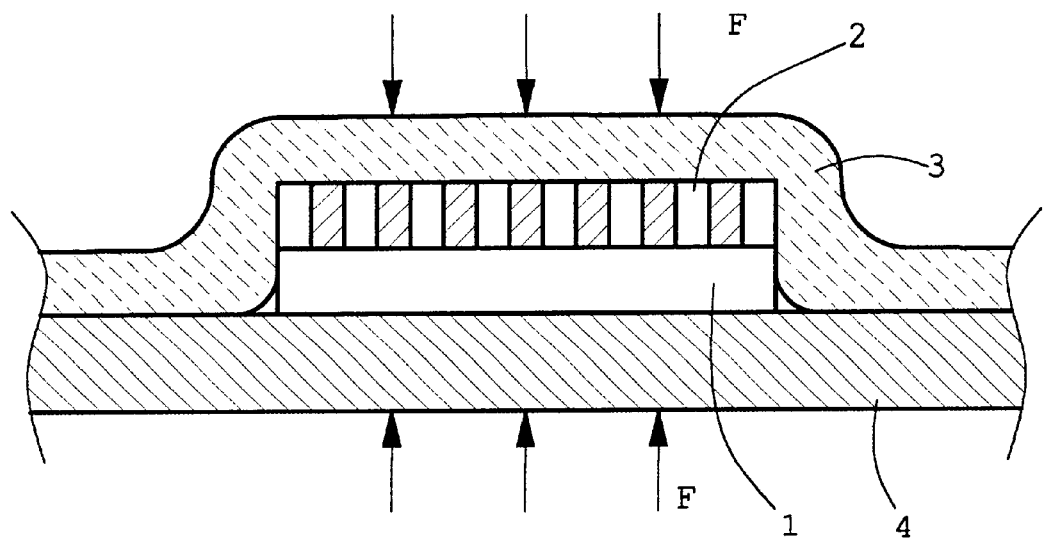

(ii) As shown in FIG. 1b, the interior surrounded by the flexible film 3 and the rigid plate 4 is depressurized, and in this state, pressed (arrow F in this Figure) from the outside at least in the laminating direction and heated to allow junction of the semiconductor wafer 1 and ACF 2, whereby a wafer with ACF is obtained. Hereinafter, the flexible film is also simply referred to as a "film".

In the above-mentioned step (i), by the "sandwiched in the laminating direction and depressurizably surrounded" is meant basically that the laminate article is entirely surrounded in such a manner that the inside of the surrounding can be depressurized. In particular, from the aspect of the both outer surfaces A and B of the laminate article, it means having the both nearly in close contact with the both outer surfaces A, B before depressurization, so that the film 3 and rigid plate 4 can be in close contact with the both outer surfaces A, B (or, can be pressed from the outside in the laminating direction), when the inside of the surrounding is depressurized. As shown in the embodiment of FIG. 1a, the film 3 and rigid plate 4 sandwich the laminate article, while an outer periphery of the laminate article is enclosed by the film 3 closing toward the rigid plate 4. In the following, sandwiching in the laminating direction and depressurizably surrounding is briefly referred to as to "surround" and the state thereof is simply referred to as "surrounding".

When a laminate article is to be surrounded with a film and a rigid plate, which side of the ACF and semiconductor wafer to be placed on the rigid plate side is not particularly limited. When ACF and a semiconductor wafer are registered on a rigid plate, and when they are laminate-joined by applying a uniform pressure from the ACF side, the wafer is preferably made to be a rigid plate side.

Figure 2A:
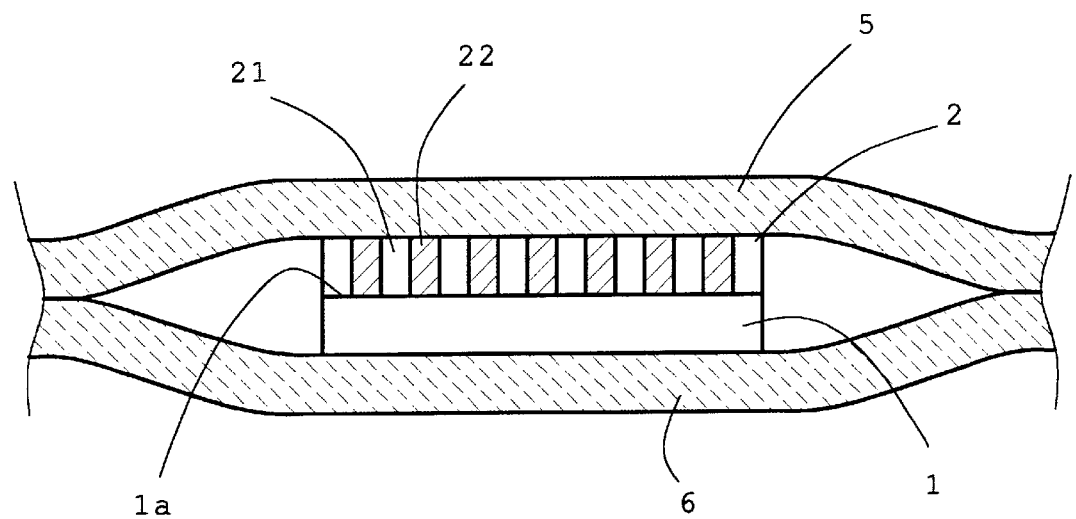
FIG. 2a and FIG. 2b show an embodiment wherein films are used for surrounding.

In an embodiment using a flexible film alone, for example, a laminate article is sandwiched and enclosed by a pair of films 5, 6, as shown in FIG. 2a. The pair of films do not mean only two films completely separated from each other but any embodiment of a film capable of sandwiching and surrounding a laminate article. For example, when one sheet of film is folded once and a laminate article is sandwiched and surrounded therebetween, the sheet forms a pair of films. The pair of films include an embodiment wherein outer peripheries of the layered two films are partially joined to give a bag, which facilitates sandwiching and surrounding of a laminate article.

Figure 3:
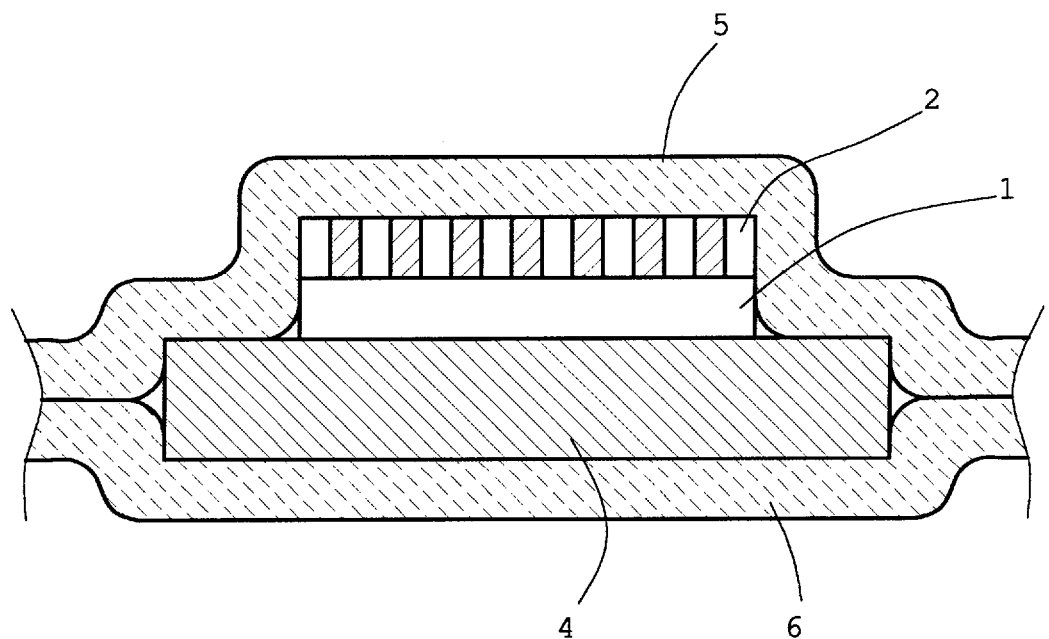
FIG. 3 shows a different embodiment wherein a film and a rigid plate are used for surrounding.

FIG. 3 shows a composite embodiment consisting of the embodiment of FIG. 1a and that of FIG. 2a, wherein film 5, film 6, and a rigid plate 4 are used for surrounding. In any of the embodiments shown in FIG. 1a, FIG. 2a and FIG. 3, at least one sheet of a film is used for surrounding, which is characteristic of the present invention. Of these embodiments, one using a film and a rigid plate as shown in FIG. 1a is preferable, because misalignment of ACF to the semiconductor wafer before junction can be suppressed and unintentional bending due to deflation of the film upon depressurization can be prevented.

The junction between a film and a rigid plate and the junction between films for sealing may be any as long as depressurization of the inside can be maintained. For example, adhesion allowing peeling, adhesion using a double-faced adhesive tape and the like, inseparable welding, connection with a tool, and the like are mentioned. The detail of the surrounding is explained below along with the explanation of depressurization step.

The film may be any as long as it is flexible enough to deflate along with a laminate article upon depressurization of the inside of the surrounding, has strength and airtightness necessary during use, and has heat resistance to stand the heating for junction to be mentioned below. Examples of the film include those having a single layer structure made from organic polymer materials, which are economical and preferable in properties. Where necessary, it may be a laminate with other material layer, such as a metal layer and the like. When ACF shows adhesive property by heating for junction, use of a polyimide resin film that allows peeling (releasability) is preferable.

The film preferably has a thickness of 25–250 $\mu$m, more preferably 30–100 $\mu$m, in view of the film strength during depressurization, and easiness of following the outer shape of a laminate article when the film is deflated due to the depressurization of the inside of the surrounding.

The rigid plate in the present invention may be any as long as it at least has a planar area that can sandwich and surround a laminate article together with a film, and does not mean only a plate. In view of the handling thereof as a jig, however, a plate is preferable. While the material of a rigid plate is not limited, a plate superior in thermal conductivity during heating, which is hardly deformed or hardly oxidized, such as aluminum plate and SUS plate, is preferably used.

Figure 5A:
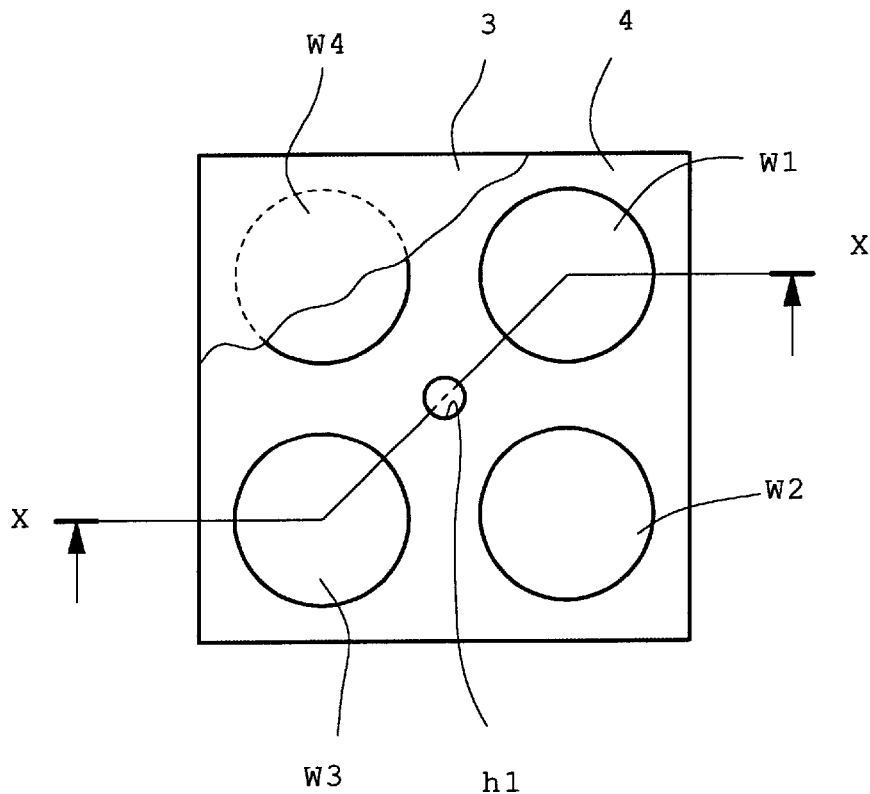
FIG. 5a and FIG. 5b show an example of a jig for large-scale production, which is used for surrounding a laminate article with a film and a rigid plate.

The outer shapes of the film and rigid plate only need to have a size capable of surrounding at least a laminate article containing ACF and a semiconductor wafer. As shown in FIG. 5a in the example of a 4-piece-setting, the productivity can be increased by employing a size permitting simultaneous setting and sandwich/surrounding of multiple laminate articles W1 to W4 in this Figure). For multiple-piece-setting, a semiconductor wafer and ACF are used in a one-to-one pair, wherein the area of ACF is capable of covering the entirety of multiple pieces of semiconductor wafers, which is, after junction, diced into semiconductor wafer units.

Figure 2B:
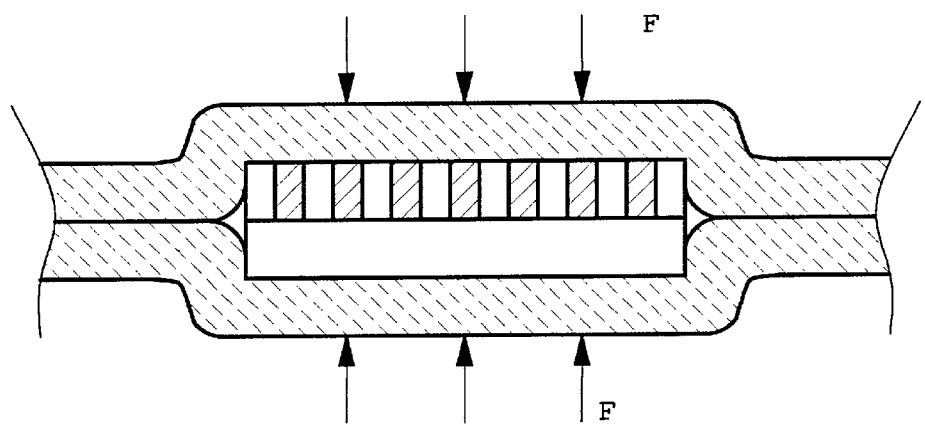
Figure 4:
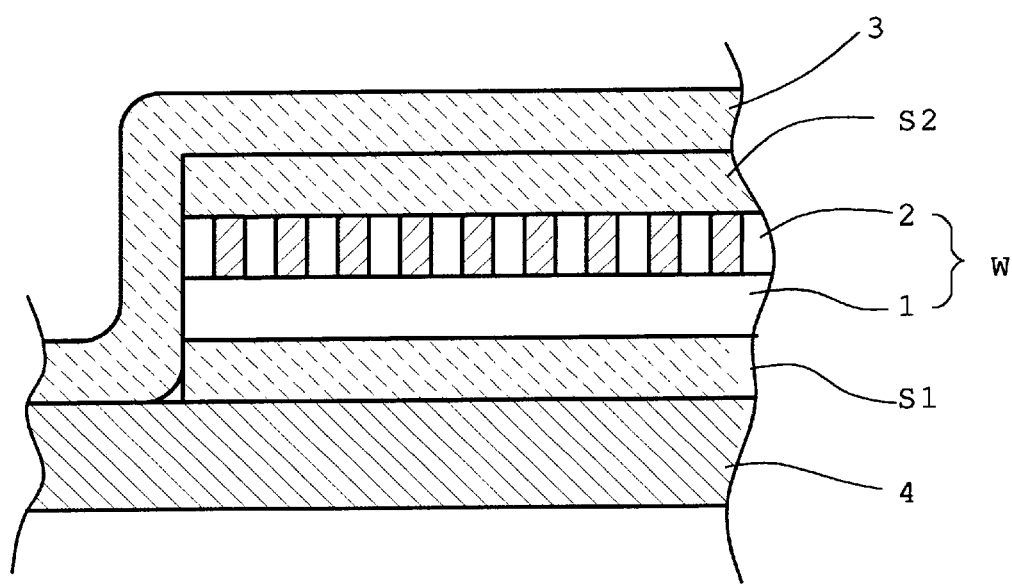
FIG. 4 shows an embodiment wherein various functional layers are intervened when sandwiching and surrounding a laminate article.

When a laminate article is sandwiched/surrounded with films or a film and a rigid plate, the article may not be directly sandwiched, but various functional layers may be present as necessary. One example is shown in FIG. 4, wherein a heat resistant release layer S2 having peeling property (releaseabiilty) is formed between ACF 2 and film 3. By this constitution, film 3 can be easily peeled after forming a wafer with ACF by heating and pressurizing. The same applies to the peeling property of semiconductor wafer 1 and rigid plate 4 as shown in FIG. 1a and FIG. 1b, and to the peeling property of semiconductor wafer 1 and film 6 as shown in FIG. 2a and FIG. 2b. This embodiment is particularly useful for enhancing the peeling property of the film from ACF that shows adhesive property by heating.

The release layer is preferably a heat resistant film such as polyimide film, fluorocarbon film and the like. It may have a layer of a release agent used for forming and the like, which is applied onto the heat resistant film. Particularly, a fluorocarbon film is preferable from the aspect of peeling property. A release layer preferably has a thickness of about 25–250 $\mu$m, which is particularly preferably 30–200 $\mu$m, from the aspect of peeling property.

Other examples of the functional layer include an embodiment wherein, as shown in FIG. 4, a cushion layer S1 is disposed between semiconductor wafer 1 and rigid plate 4. By this constitution, the isotropic pressure applied on a semiconductor wafer that cambered toward the side of a circuit forming face, under depressurization or vacuum can be dispersed by the cushion layer S1, proving effective for prevention of cracking of wafer.

In the above-mentioned (ii), a method for depressurizing the inside of the surrounding is, for example, a method for suction of only the air of the inside of the surrounding, a method for depressurizing the entire (inside and outside) surrounding and the like. The effect of depressurization is not only the removal of air voids from the junction between the semiconductor wafer and ACF, but also sandwiching of a film in close contact with a laminate article, thereby facilitating pressurization to follow. This is a significant feature of depressurization and pressurizing using a film. The vacuum for depressurization is preferably about 30 mmHg–0 mmHg, particularly 20 mmHg–0 mmHg. The apparatus for depressurization may be various depressurization apparatuses such as vacuum pump and the like.

The mode of surrounding to maintain the inside of the surrounding in a vacuum state may be determined freely if it fits the setting from a depressurization step to a heating and pressurizing step.

Figure 5B:
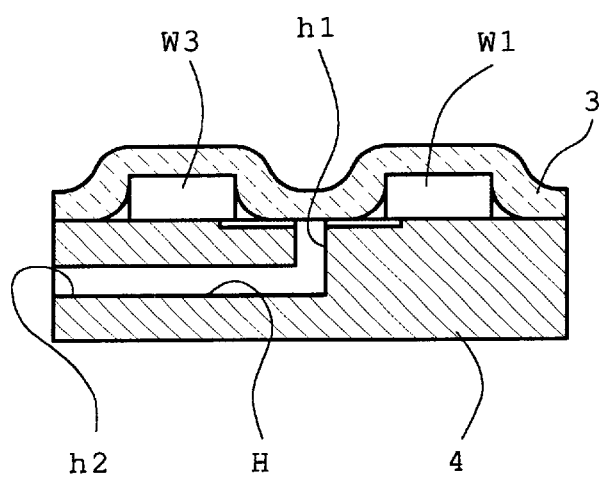
Figure 6:
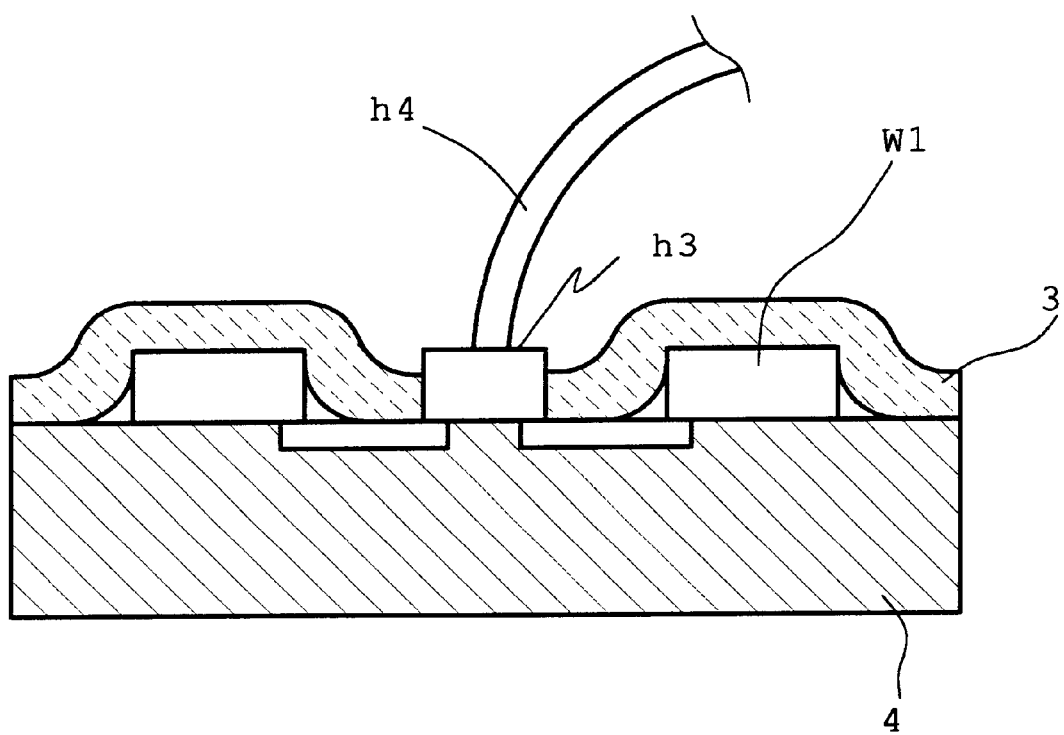
FIG. 6 is a sectional view showing a different example of a jig for large-scale production, which is used for surrounding a laminate article with a film and a rigid plate. A suction head and a suction tube are not shown in section. The top view is the same as FIG. 5a except the suction head.

(1) When, for example, the surroundings, whose inside is vacuumized in a depressurization step, are produced in a large number and heat/pressed in mass production in a different step, the mode of surrounding should preferably permit easy depressurization and handling of independent vacuum packs after vacuumizing the inside. Such embodiment includes one wherein a valve or closable opening is formed on a part of a surrounding and the like. For example, an embodiment wherein a valve, such as a coupler and the like, is attached to an outer opening h2 of the jig of suction hole H as shown in FIG. 5b or a suction head h3 of the jig of FIG. 6, is shown. By such embodiment, mass production is achieved in a step for only surrounding, depressurizing and enclosing a laminate article, thereby facilitating handling up to the heating and pressurizing step.

Figure 7:
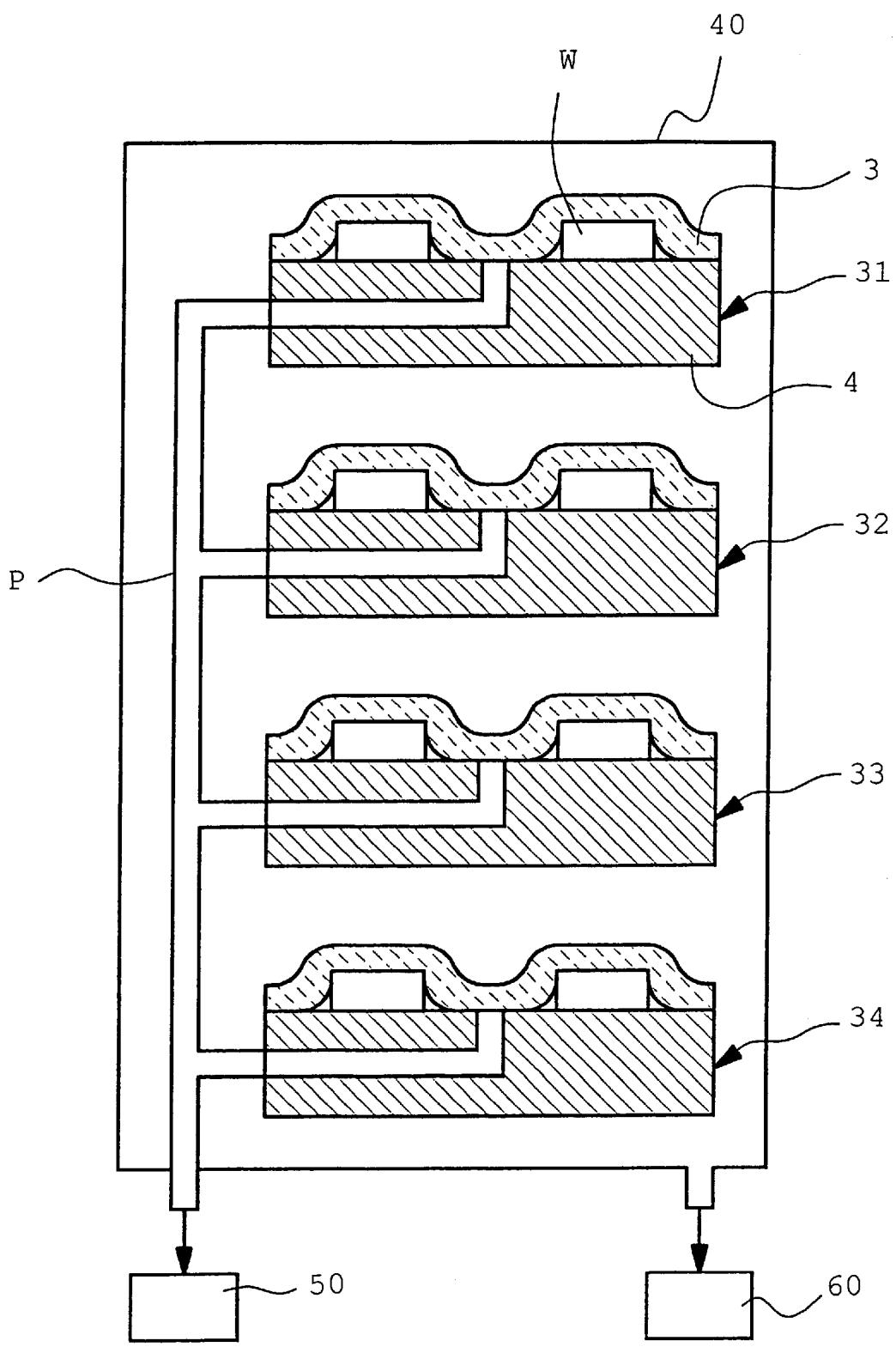
FIG. 7 is a sectional view showing an example of an apparatus simultaneously comprising plural large-scale production jigs shown in FIG. 5a and FIG. 5b to enable depressurization, heating and pressurizing.

(2) When, for example, depressurization, heating and pressurizing are successively conducted in situ (in the same apparatus), an embodiment as the above-mentioned (1), which permits release of the surrounding itself as an independent vacuum pack, as well as an embodiment shown in FIG. 7 may be employed, where the surrounding is connected to a depressurization apparatus while maintaining a vacuum.

For pressurizing the surrounding from the outside in the above-mentioned step (ii), the laminate is preferably pressed at least in the laminating direction of the laminate article and pressed uniformly on the entire surface of the laminate article, so that ACF can be joined uniformly with a semiconductor wafer. While the method of pressurizing is not limited, mechanical pressurizing comprising sandwiching and compressing with a rigid member such as a press apparatus and the like tends to easily cause cracks, breakage and the like of the semiconductor wafer, due to a failure to control pressurization when a laminate article is joined. In contrast, a method of pressurizing from the outside by changing a fluid surrounding the surrounding to a high pressure fluid and pressing the surrounding from the outside is preferable, because it easily permits fine control of a pressurizing force even if a laminate article warps. In addition, pressurizing with a fluid enables uniform pressurizing of the entirety, even if a laminate article has an uneven thickness and even if a laminate article is warped, which is characteristic of the pressurizing with a fluid. The present invention is explained by referring to an example wherein a fluid (particularly a gas) is used for pressurizing.

While a fluid used for pressurizing is free of any limitation, a gas is preferable, which is preferably exemplified by air, nitrogen, hydrogen, chlorofluorocarbon, other inert gas and the like. When a metal such as copper and the like is used for the conductive path of ACF, the conductive path may come into contact with the air and may be oxidized when the inside and outside of the surrounding are released. The use of nitrogen is preferable for preventing this and in view of the safety during pressurization.

The method of heating in the above-mentioned step (ii) includes a method of making the gas to be used for pressurizing have a high temperature, a method of placing a heater exclusively for the heating near the surrounding, a method of blowing a hot air and the like. The apparatus preferable for heating and pressurizing is an autoclave. A jig for surrounding, a closed chamber, a depressurization apparatus, a press apparatus and a heating apparatus may be combined to constitute a desired production apparatus. The heating temperature may be any as long as a semiconductor wafer and ACF can be joined, which is, when adhesive property on heating is utilized, for example, preferably 140° C.–220° C., particularly 150° C.–180° C.

When depressurization of the inside of the surrounding and heating and pressurizing from the outside of the surrounding are to be conducted in situ, as in the above-mentioned (2), it is preferable that heating and pressurizing be applied after completion of the depressurization. It is also preferable that the inside of the surrounding be kept in vacuum until the completion of the heating and pressurizing. In any case, the time chart of (depressurization and release thereof of the inside of the surrounding), (heating and cooling from the outside of the surrounding) and (pressurizing and release thereof of the outside of the surrounding) can be optimized in consideration of the quality and mass productivity, as long as heating and pressurizing can be applied from the junction part, while removing air voids and inhibiting return of the air voids to the junction, and the like.

In the time chart of the above-mentioned (heating and cooling from the outside of the surrounding) and (pressurizing and release thereof from the outside of the surrounding), the cooling preferably follows release of pressurization, whereby cracks and breaks due to warp of the obtained wafer with ACF can be reduced. This is because, when cooled with pressurizing, the stress applied to the semiconductor wafer, which is generated by cooling, becomes greater than the strength of the semiconductor wafer, because the obtained wafer with ACF may significantly warp due to the different coefficients of linear expansion of the semiconductor wafer and ACF, as a result of which the semiconductor wafer gets broken. During pressurizing, the pressure is preferably released when heating temperature reaches the adhesion temperature, and cooling is started when it reaches the atmospheric pressure.

One example of the constitution as in the above-mentioned (2), wherein depressurization of the inside of the surrounding and pressurizing from the outside of the surrounding are sequentially done in situ (in the same apparatus), and in a mass production-like manner, is shown in the following.

FIG. 5a and FIG. 5b show one example of a jig for mass production wherein a film and a rigid plate are used for surrounding, which affords simultaneous processing of four 4 inch wafers. As shown in FIG. 5a, a rigid plate 4 can alignment-set four laminate articles W1–W4 on its upper face. A film 3 can cover the entire top face of the rigid plate 4, and each laminate article can be sandwiched and depressurizably surrounded with the film 3 and the rigid plate 4.

The film and rigid plate shown in FIG. 5a and FIG. 5b can be detachably sealed with each other at the outer periphery. The rigid plate 4 has a suction hole H communicating the inside and the outside of the surrounding. A tube from a depressurization apparatus can be connected with an outer opening h2. An inner opening h1 preferably has a structure that permits depressurization of the whole inside of the surrounding to an objective value, without causing blocking of the opening h1 with the film 3. For example, a structure comprising grooves for a suction channel in a suitable pattern advancing toward each laminate article and outer periphery from the inner opening h1, a structure comprising a number of openings h1 branching from a suction hole H, a structure comprising a porous wide area of a surface layer of a rigid plate, with which an inner opening h1 is connected and the like are shown. Alternatively, ACF may be made to have a size capable of embracing the entirety of a multi-piece-setting semiconductor wafer, and the irregularities and penetrating holes on the surface of the ACF are used as suction paths.

FIG. 6 shows a different example of a jig for mass production, wherein a film and a rigid plate are used for surrounding. The embodiment of FIG. 5a and FIG. 5b are different in that the embodiment of FIG. 6 comprises a suction hole communicating the outside and the inside of the surrounding set on the film side. In the embodiment of FIG. 6, a suction hole is formed in the center of the film as a suction head h3 (h4 is suction tube), but is not limited to this embodiment. The suction hole can be formed in any number at preferable positions for depressurization of the inside, such as outer periphery of the film and the like. Various suction path channels can be formed to permit depressurization of the whole inside of the surrounding to an objective value, without blocking suction holes formed in the film during depressurization, as in the case of FIG. 5a and FIG. 5b.

FIG. 7 shows an embodiment of an apparatus for simultaneous processing of plural jigs for mass production, which are shown in FIG. 5a, FIG. 5b and FIG. 6, that affords depressurization, heating and pressurizing. Jigs 31–34 for mass production, which are shown in FIG. 5a and FIG. 5b, are set in a closed chamber 40 capable of heating and pressurizing. The number of arrangements, direction of arrangement and method of arrangement are not limited. Each of the jigs 31–34 for mass production is connected to an apparatus 50 for depressurization by piping P, thereby enabling simultaneous depressurization of the inside of the surrounding. A gas for pressurizing is injected into the closed chamber 40 from an apparatus 60 for pressing, thereby enabling simultaneous pressurizing of all the jigs 31–34 for mass production. A heating apparatus is not shown in the Figures. A heater, a hot wind blower and the like are set as appropriate separately or in combination.

The foregoing explains an apparatus for mass production.

Figure 11:
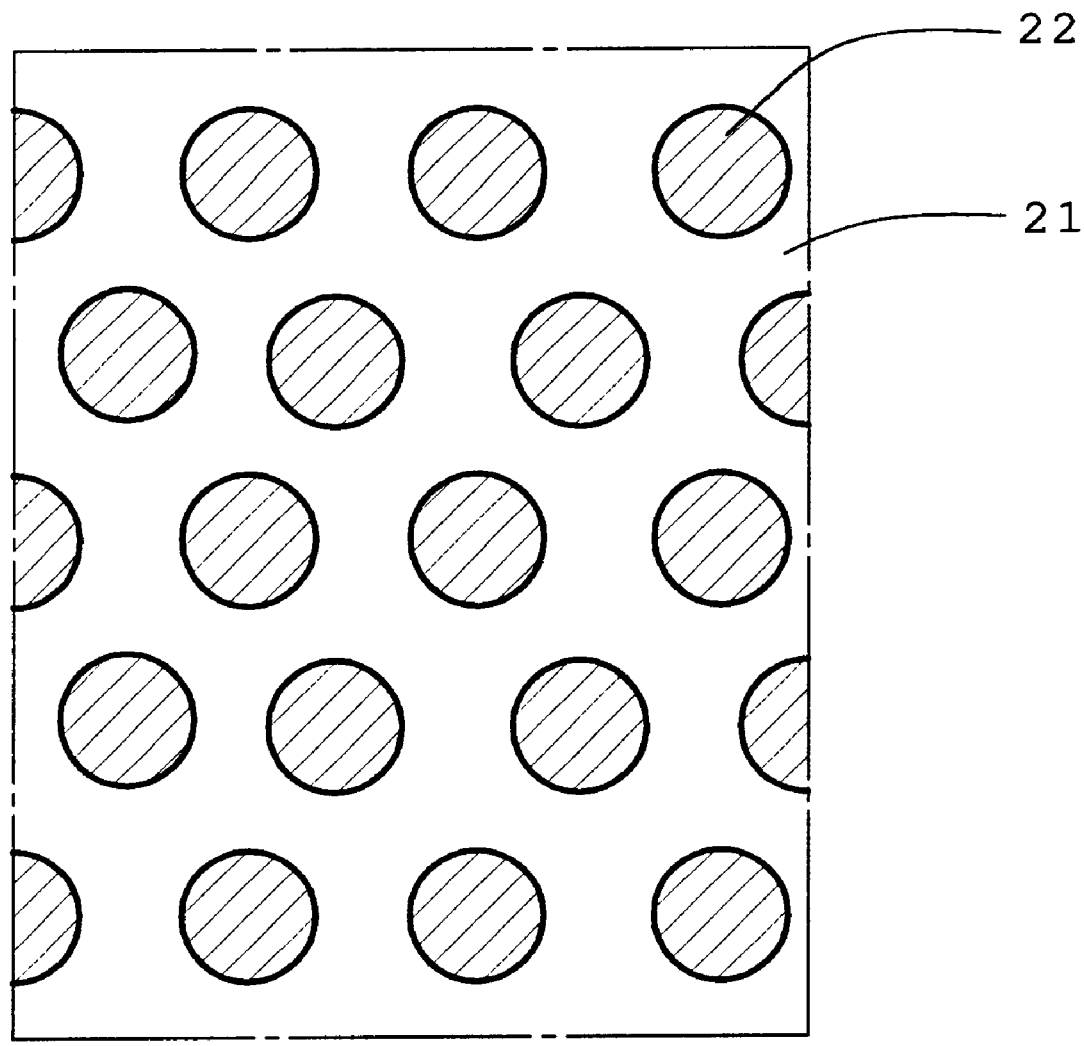
FIG. 11 is a partially enlarged schematic view of the film surface of ACF.

ACF has a structure as shown in FIG. 1a, FIG. 1b and FIG. 11, wherein plural conductive paths 22 are insulated from each other in a film substrate made from an insulating resin 21, and penetrate a film substrate 21 in the thickness direction thereof. The end of each conductive path may protrude from the face of a film substrate or may be in the same plane, depending on the electrode of an element structure.

The preferable coefficient of linear expansion of ACF is 10–150 ppm, and 10–80 ppm is particularly preferable. The elastic modulus is, 1–5 GPa, and 1–4 GPa is particularly preferable.

While the coefficient of linear expansion and elastic modulus of ACF differ between the thickness direction and the direction to which the film face expands, the coefficient of linear expansion and elastic modulus of the direction to which the film face expands are used in the present invention.

The thickness is 10–200 $\mu$m, among others, 25–100 $\mu$m is particularly preferable.

The insulating resins to be used for the film substrate of ACF are those conventionally used for ACF. Particularly, a material that shows adhesive property during heating and pressurizing is preferably joined. Examples of such material include polyester resin, polyamide resin, polycarbodiimide resin, phenoxy resin, epoxy resin, acrylic resin, saturated polyester resin and the like.

A material for forming a conductive path in ACF may be a known conductive material. In view of electric properties, a metal material, such as copper, gold, aluminum, nickel and the like, are preferable, and in view of the conductivity, copper and gold are more preferable. These metallic conductive path preferably has an outer diameter of 5 $\mu$m–30 $\mu$m.

The material of the conductive path is as mentioned above. The same metal material shows various different properties of conductivity, elastic modulus and the like depending on the method for forming a conductive path. While the conductive path may be formed by plating a metal material on the inside of a penetrating hole formed in a film substrate, a conductive path formed by penetrating a film substrate with a metal wire is preferable. Of the metal wires, for example, a metal conductor wire produced to conduct electricity, such as a copper wire and the like defined in JIS C 3103 is preferable, because it affords a conductive path most superior in the electric property, mechanic property and cost.

To obtain the above-mentioned metal conductor wire penetrating a film substrate, for example, a number of insulated wires are densely bundled, inseparably fixed and sliced in a desired film thickness with a plane forming an angle with each insulated wire as a cutting plane. Such mode of ACF and a method for production thereof are described in detail in WO98/07216, "ANISOTROPIC CONDUCTIVE FILM AND METHOD FOR MANUFACTURING SAME".

In a preferable embodiment, a solder layer of Sn, Sn/Ag, Sn/Pb, Sn/Zn, Sn/Ag/Cu, Sn/Bi and the like is formed at least on one of the both ends of the conductive path of ACF. The solder layer may be a thin layer or has a high protrusion, such as a solder ball. By forming a solder layer on the end on the outer side (opposite side from the side joined with semiconductor wafer), the connection reliability between semiconductor element (wit ACF) and an external circuit board after dicing is improved, and the structure of a package can be simplified and a connection with an external circuit board can be achieved at a low cost. By forming a solder layer on the end of junction with a semiconductor wafer, junction with an electrode of a semiconductor element can be formed with a solder layer alone of a conductive path, without relying on the adhesive property of the film substrate of ACF.

The solder layer is preferably formed at the stage of a wafer size (before dicing), by which a solder layer can be formed easily on the end of all conductive paths by a single treatment. As compared with a treatment to form a solder layer one by one after dicing into a chip size, this treatment is efficient and affords preferable quality. By this treatment, ACF is joined with a semiconductor wafer, diced into respective elements, and adhered and reflowed at a low temperature during mounting on an external circuit board, thereby melting a solder layer and enabling easy metal junction with an electrode of an external circuit board.

A method of forming a solder layer on the end of a conductive path is not limited and includes screen, ink jet, solder ball mount, electrolytic plating, electroless plating and the like. In addition, a method of forming a solder layer on the end of the outer side of a conductive path may be applied before or after junction of ACF with a semiconductor wafer. When a solder layer is formed on the end of the outer side of a conductive path prior to junction, the thermal condition for junction of ACF with semiconductor wafer is preferably not higher than the melting point of the solder.

The shape of the outer periphery of ACF may be any as long as it can include the circuit of a semiconductor wafer. In view of the alignment, ACF preferably has the same outer shape with a semiconductor wafer, or a slightly smaller outer shape than a semiconductor wafer, to afford easy alignment.

As mentioned above, due to drastically different coefficient of linear expansion between semiconductor wafer and ACF, the obtained wafer with ACF may warp greatly. To inhibit the warp, the present invention proposes an embodiment wherein a layer for inhibiting warp is formed on a rear face of the semiconductor wafer, in addition to a laminate article wherein a semiconductor wafer and ACF are layered, thereby making a laminate article having a three layer structure. A junction product according to this embodiment is the wafer with ACF of the embodiment of the above-mentioned (8) according to the present invention.

When ACF generates an expansion-shrinkage force due to temperature changes, or, for example, generates warp in the entirety to shrink, this inhibiting layer shrinks to generate warp in the opposite direction at the same temperature change, thereby to antagonize and cancel the warp.

The constitution and material of the inhibiting layer is free of any limitation, but to effectively cancel warp due to expansion and shrinkage of ACF, the coefficient of linear expansion, elastic modulus and thickness of the inhibiting layer are to be noted as important factors.

The wafer with ACF of the embodiment of the above-mentioned (8) is explained in detail in the following.

Figure 8:
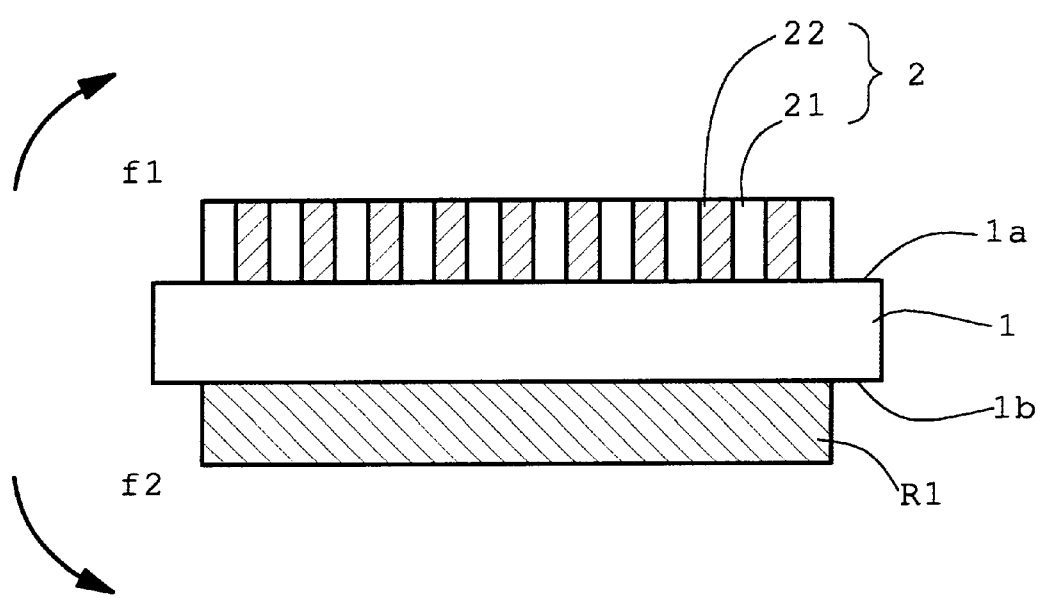
FIG. 8 is a sectional view showing the constitution of a wafer with ACF of he above-mentioned (8) of the present invention, wherein the detailed inner structure of a semiconductor wafer 1 has been omitted. For easy explanation, the thickness of the conductive path in the ACF and the longitudinal and horizontal dimensional ratios have been changed for exaggeration, and hatching is used for demarcation.

In the wafer with ACF of the embodiment of the above-mentioned (8), as shown in FIG. 8, ACF 2 is joined with the circuit face 1a of the junction semiconductor wafer 1, and the is rear face 1b of the semiconductor wafer 1 is joined with the inhibiting layer R1. When ACF 2 generates an expansion-shrinkage force, or, for example, generates warp in the f1 direction to shrink due to temperature changes, the inhibiting layer R1 shrinks to generate warp in the opposite direction f2 at the same temperature change, thereby to antagonize and cancel the warp.

By this constitution, for example, when ACF 2, semiconductor wafer 1 and inhibiting layer R1 are heated and joined upon sufficient thermal expansion of each member as shown in FIG. 8, the whole structure is kept from warping because shrinkage of ACF 2 upon cooling is antagonized by the shrinkage of inhibiting layer R1. Depending on the thermal condition of junction and the temperature thereafter, ACF may expand and generate warp in the f2 direction, opposite from the aforementioned case. In this case, the inhibiting layer expands in the opposite direction f1 to inhibit warp as a whole.

The material and structure of the inhibiting layer is free of any limitation, as long as it antagonizes the expansion-shrinkage force by thermal expansion (shrinkage) of ACF and thermally expands (shrinks) to cancel warp. The structure of the inhibiting layer is exemplified by a uniform single layer structure formed with the same material, a single layer structure wherein the mixing ratio of the materials and properties show stepless inclination, a laminate structure comprising different laminate materials, a composite structure comprising different materials optionally combined and the like. Specifically, a structure wherein the coefficient of linear expansion and elastic modulus are changed in the thickness direction to meet the desired expansion-shrinkage property, and an embodiment using ACF made in completely the same manner as in ACF of the circuit face, as an inhibiting layer, are shown.

Of the embodiments of the inhibiting layer, a uniform single layer structure made only from the same material is preferable, because it affords low costs of material and production, and permits easy calculation of expansion and shrinkage properties at each temperature. This embodiment is explained in the following.

To effectively cancel warping due to expansion and shrinkage of ACF in a homogeneous single layer structure with an inhibiting layer made from only the same material, the coefficient of linear expansion, elastic modulus and thickness of the inhibiting layer should be noted as important factors. The coefficient of linear expansion directly shows the relationship between temperature variation and size variation and is therefore important. Mere drastic changes in size, which are easily subdued by external force and allow compression, fail to achieve the object. Therefore, a certain level of elastic modulus is important. The thickness is directly related to the size of force that tries to bend the wafer when it warps, wherein a greater thickness generates a greater bending force. The inhibiting layer is formed to preferably cancel warp according to ACF, by determining the coefficient of linear expansion, elastic modulus and thickness.

In view of the property of ACF below, the inhibiting layer preferably has a coefficient of linear expansion of 10–200 ppm, particularly preferably 20–150 ppm. The preferable elastic modulus is 0.1–20 GPa, particularly preferably 0.5–15 GPa. Examples of the material to meet these values include organic polymer materials such as epoxy, acrylic resin, polyester, polyethylene, polystyrene, nylon and the like of these, epoxy resin, acrylic resin and the like can directly adhere to a wafer of Si crystal and the like. The inhibiting layer has a thickness of 1–100 μm, preferably 5–80 μm.

The method of joining the inhibiting layer to a semiconductor wafer and the method of forming the inhibiting is layer include, for example, a method comprising joining an inhibiting layer formed separately by the use of adhesive property of itself, a method comprising joining via an adhesive layer, a method comprising applying a liquid resin to a wafer and simultaneously curing same when joining ACF and the like.

In the present invention, for determination of the coefficient of linear expansion, elastic modulus and thickness of the inhibiting layer, the aforementioned factors are selected such that a $(\alpha1 \times E1 \times t1)/(\alpha2 \times E2 \times t2)$ ratio of a product $(\alpha1 \times E1 \times t1)$ of a coefficient of linear expansion $\alpha1$, an elastic modulus $E1$ and a thickness $t1$, of ACF, to a product $(\alpha2 \times E2 \times t2)$ of a coefficient of linear expansion $\alpha2$, an elastic modulus $E2$ and a thickness $t2$, of the inhibiting layer, falls under a certain range, whereby warp can be effectively inhibited.

When this ratio $(\alpha1 \times E1 \times t1)/(\alpha2 \times E2 \times t2)$ is 0.5–2.0, warp does not become a great obstacle in practical use and does not cause a problem during processing, transport of dicing, and the like. Particularly, when it is 0.6–1.0, a preferable semiconductor wafer with ACF, wherein warping is sufficiently inhibited, can be obtained.

Figure 9:
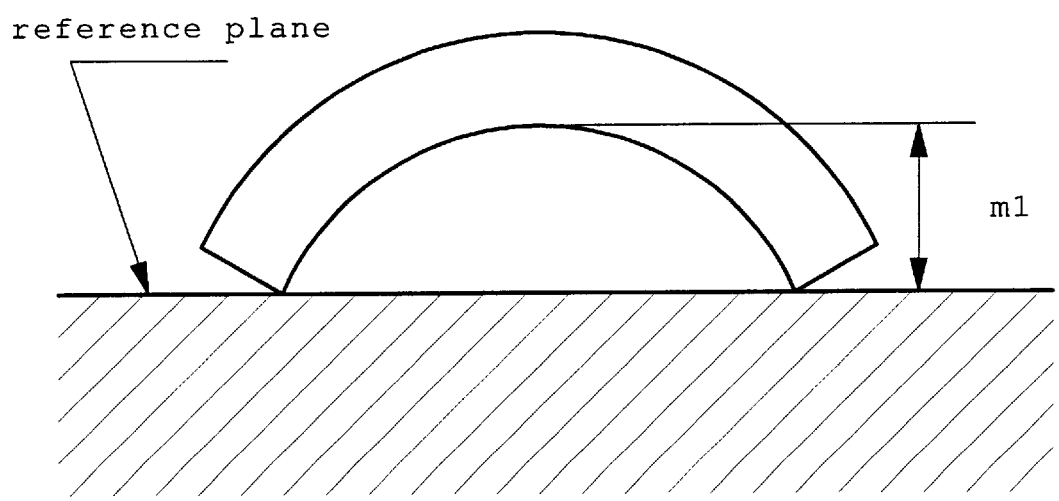
FIG. 9 defines the amount of warp of a wafer with ACF.
Figure 10:
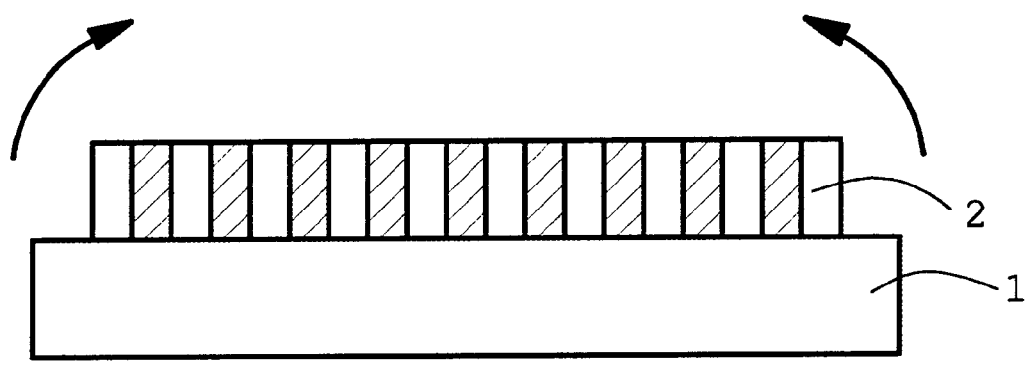
FIG. 10 is a sectional view of a wafer with ACF without an inhibiting layer.

The amount of warp of the semiconductor wafer with ACF shows, as shown in FIG. 9, a distance m1 to the peak of the curvature most distant from the reference plane when a test subject is placed to form a convex in the direction away from a reference plane, when warped in either side. With the symbol of warp in the ACF side being + and − in the opposite case, an 8 inch wafer preferably shows the amount of warp m1 of within ±4 mm, particularly within ±2 mm.

The above-mentioned inhibiting layer may contain a coloring agent for marking individual identification and the like. While the coloring agent is not limited, for example, carbon, iron red and the like are exemplified.

The shape of the outer periphery of the inhibiting layer is free of any limitation, but because warp can be antagonized in the entire surface of a semiconductor wafer and in view of alignment, it preferably has the same outer shape.

When a wafer with ACF is produced, to prevent the obtained wafer with ACF from generating warp, a semiconductor wafer is heated and/or pressed and ACF (circuit face), and an inhibiting layer (rear face) are preferably joined successively or simultaneously, so that each expansion-shrinkage force antagonizes with each other to inhibit warp. For example, the three members are separately heated in advance to allow thermal expansion of each and then pressed against each other to complete junction, or the three members are pressed against each other at room temperature and heated and joined. Alternatively, a semiconductor wafer and an inhibiting layer are joined with heating, then ACF is joined with a circuit side of the semiconductor wafer, and cooled. In addition, an inhibiting layer may be formed on a rear face of a semiconductor wafer, and heated at 150° C.–200° C., with which ACF may be joined under such high thermal condition.

The wafer with ACF of the above-mentioned (8) may be joined and formed by a conventionally known heating method and pressurizing method. To sufficiently show the characteristic of preventing warp from being generated, the production method of the above-mentioned (1) is preferably used for joining. That is, the three members are registered to give a laminate, which is sandwiched and depressurizably surrounded with flexible films or with a flexible film and a rigid plate in the laminating direction, the interior is depressurized, heated from the outside as is using an autoclave and the like, and pressed with an air to integrate the laminate of the three members.

EXAMPLES

According to the production method of the above-mentioned (1), a wafer with ACF was actually produced and evaluated for properties, the results of which are shown in Examples 1–5.

A semiconductor wafer is a disc comprising a silicon wafer and an integrated circuit repeat formed in a matrix thereon, wherein the outer shape is 4 inch and the total thickness is 150 μm.

ACF is, as described in the above-mentioned WO98/07216, obtained by winding an insulated cupper wire, melt welding same to give a winding block, and slicing same, and has an outer shape of 80 mm×60 mm and a thickness of 70 μm. The material of an insulating film is polycarbodiimide (softening temperature 110° C.; the softening temperature is a temperature of inflection point when temperature elevated at TMA pull mode, 10° C./minute.

Example 1

In this example, a film and a rigid plate were used as shown in FIG. 1a and FIG. 1b, and sandwiched and surrounded as shown in FIG. 5a and FIG. 5b by 4-piece setting.

The film was a polyimide film having an outer shape 310 mm×430 mm, thickness 50 μm, which does not have a melting point but has a glass transfer temperature of 285° C. (UPIREX R, UBE INDUSTRIES LTD.).

The rigid plate used was one made from an aluminum material (2017-TA), size 310 mm×430 mm, thickness 15 mm).

The semiconductor wafer and ACF were superimposed to give a laminate article. Four thereof were placed on a rigid plate to make a semiconductor wafer on a rigid plate side, covered with a film and surrounded to make the laminate article sandwiched between the film and the rigid plate, and the outer periphery was sealed. As shown in FIG. 5b, the inside of the surrounding was vacuumized with a vacuum pump at 10 mmHg through a suction hole of a rigid plate. The outer opening of the hole was sealed to give a package of the laminate article surrounded with depressurized inside. This package was set in an autoclave (Ashida Seisakusho Corp.).

For pressurizing in an autoclave, a nitrogen gas was used. Heating and pressurizing were simultaneously started at temperature elevation at a rate of 10° C./minute and pressure elevation at a rate of 0.98 MPa/minute, and continued to 180° C., 4.9 MPa to join a semiconductor wafer and ACF.

When the temperature of the laminate article in the autoclave reached 180° C., cooling was started at a rate of 10° C./minute, and when the temperature decreased to 60° C., depressurizing was started at a rate of 0.98 MPa/minute. When the temperature of the laminate article decreased to 30° C., the film closely in contact with ACF was peeled and four wafers with ACF were taken out. Due to the conditions of cooling and depressurizing, and the lack of a cushion layer, partial breakage was caused, but the usefulness of the production method of the present invention was sufficiently established.

The wafer with ACF obtained in the above was diced with DUAL DICER DFD 651 (DISCO CORPORATION) to give 8 mm×8 mm square semiconductor chips with ACF. For dicing, blades of NBC-ZH1050 and NBC-ZH205F were used and at rotation 40000 rpm, cut speed 10 mm/sec and semiconductor wafer side with ACF was cut 60 μm with NBC-ZH1050 and then the wafer was completely cut off with NBC-ZH205F.

Example 2

In this example, a wafer with ACF was produced in the same manner as in Example 1 except the conditions for cooling after junction and depressurizing in the above-mentioned Example 1.

For cooling and depressurizing, when the temperature of the laminate article in the autoclave reached 180° C., the pressure was decreased to an atmospheric pressure at a rate of 0.98 MPa/minute, and when the pressure reached the atmospheric pressure, cooling was simultaneously started. When the temperature of the sample reached 30° C., a polyimide film was peeled to give 4 wafers with ACF without crack or break.

Example 3

In this example, simultaneous processing of plural products according to the production method of the present invention was tested, and mass produceability of the production method of the present invention was confirmed.

As shown in FIG. 5a and FIG. 5b, a laminate article was set in a surrounding state in a 4-piece-setting mass production jig (a polyimide film and a rigid plate were used for a surrounding structure as in the above-mentioned Example 1) and two sets thereof were prepared. These were disposed in two, upper and lower tiers as shown in FIG. 7 in a closed chamber capable of heating and pressurizing at an interval of 20 mm and subjected to joining.

After junction, when the temperature of the sample reached 30° C., a polyimide film was peeled from each rigid plate to give 8 fine products of wafer with ACF. By this step, suitability of the present invention for simultaneous processing of multiple products was confirmed.

Example 4

This example relates to an embodiment comprising a release layer for sandwiching and surrounding a laminate article. In this example, a wafer with ACF was produced in the same manner as in Example 1 except that a 70 μm thick fluorine film was disposed between a film and ACF in the above-mentioned Example 1 when a laminate article was sandwiched and surrounded. After junction, the film for surrounding was easily peeled from ACF, whereby usefulness of the intervention of the release layer could be confirmed.

Example 5

In this example, a cushion layer was used for sandwiching and surrounding a laminate article. A wafer with ACF was produced in the same manner as in Example 1 except that a porous polyester film was used as a cushion material between the rigid plate and the semiconductor wafer when a laminate article was sandwiched and surrounded in the above-mentioned Example 1.

As the polyester film as a cushion material, Airwave (trademark) N-7 (AIRTEC CORPORATION) having an initial thickness of 3.66 mm and a thickness of 0.144 mm at maximum compression was used.

After junction, when the sample reached 30° C., the surrounding was released and the cushion material was peeled. As a result, 4 pieces of wafers with ACF free of crack or break were obtained. Thus, the usefulness of the intervention of the cushion layer could be confirmed.

Comparative Example 1

For comparison with Example 1, a wafer with ACF was produced in the same manner as in Example 1 except that heating and pressurizing were performed without depressurization of the inside of the surrounding. Other conditions are as in Example 1. The obtained wafer with ACF as diced into a chip size and the junction state was examined. As a result, 70% of the chips allowed easy peeling of ACF from the semiconductor wafer due to voids in the junction and the rest of the chips showed poor junction state including many voids.

Comparative Example 2

In this Comparative Example, a wafer with ACF was prepared by heating and pressurizing in a vacuum without surrounding with a film using a vacuum press apparatus (KITAGAWA SEIKI CO., LTD.) capable of mechanically pressurizing using two rigid plates in a vacuum chamber. A laminate article of a semiconductor wafer and ACF was heated to 180° C. at a rate of 7° C./minute in the chamber at 0 mmHg, and a minimum pressure is of the press apparatus of 7.55 MPa was applied by compression with pressurizing plates.

When the temperature of the sample reached 180° C., the sample was cooled at a rate of 6° C./minute and the pressure was released. However, at the stage of temperature of 30° C., a number of large cracks were generated on the entirety of the wafer and the wafer was not usable.

Then, the wafer with ACF of the embodiment of the above-mentioned (8) was actually produced and shown as Examples 6–8.

In each Example, the specification of ACF was variously modified, the specification of the inhibiting layer that affords effective cancellation of warps and the specification for comparison were determined and the warp was observed.

The specification of a semiconductor wafer included 180 integrated circuits each having a 10 mm×10 mm square outer shape, which were repeat formed in a matrix, on a silicon wafer (disc having a thickness of 300 μm and an outer diameter of 6 inch).

ACF was obtained by, as described in the above-mentioned WO98/07216, winding insulated wires and melt adhered to give a winding block, and slicing the block.

Example 6

[Specification of ACF]

An end of a conductive path was on the same plane as an insulating film, and a thickness t1 was 70 μm and the outer shape was the same as a silicon wafer. The coefficient of linear expansion α1 of the whole ACF was 70 ppm and the elastic modulus E1 was 3.5 GPa. Thus, the product α1×E1×t1 was 17150. The material of the insulating film was polyimide, the material of the conductive path was Cu and the diameter of the conductive path was 18 μm.

[Specification of Inhibiting Layer]

The thickness t2 was 70 μm and the outer shape was the same as a silicon wafer. The material was epoxy resin. The coefficient of linear expansion α2 was 50 ppm, the elastic modulus E2 was 5 GPa, and therefore, the product α2×E2×t2 was 17500. The ratio (α1×E1×t1)/(α2×E2×t2) was about 1.0.

A 70 μm thick thermoplastic sheet comprising epoxy resin (100 parts by weight), novolac phenolic resin (66 parts by weight), rubber component (30 parts by weight), a cure promoter (4 parts by weight) and silica (200 parts by weight) was superimposed on the rear face side of the semiconductor wafer and ACF was superimposed on the circuit face of a semiconductor wafer to give a three-layer laminate article.

For junction of the above-mentioned three-layer laminate article, the production method of the present invention was used, which comprises surrounding with a flexible film, depressurizing the inside, pressurizing from the outside and heating. To be more specific, a square flexible film was superimposed and a bag for sealing, having three sides of the peripheral four sides air-tightly joined, was prepared, in which the aforementioned laminate article was placed. The opening was sealed while depressurizing the inside to give a vacuum package. This vacuum package was placed in an autoclave, heated at 180° C., pressed with a gas and retained for 10 min, whereby the laminate article in the vacuum package was integrated to give a wafer with ACF. Then, it was cooled while returning to the atmospheric pressure.

The wafer with ACF was taken out from the vacuum package and examined for warping. As a result, the amount of warping at room temperature was nil.

Example 7

[Specification of ACF]

The thickness t1 was 70 μm, the coefficient of linear expansion α1 was 150 ppm and the elastic modulus E1 was 1 GPa. Thus, the product α1×E1×t1 was 10500. The material of the insulating film was polyamide, the material of the conductive path was Cu and others were the same as in Example 6.

[Specification of Inhibiting Layer]

The thickness t2 was 36 m, the material was unsaturated polyester, the coefficient of linear expansion α2 was 140 ppm, the elastic modulus E2 was 3 GPa and others were the same as in Example 6.

The product α2×E2×t2 was 15120 and the ratio of (α1×E1×t1)/(α2×E2×t2) was about 0.7.

The method of forming an inhibiting layer and the junction method of ACF were the same as in Example 6. The wafer with ACF obtained was examined for warping. As a result, the wafer warped to the side of an arrow f2 in FIG. 1 and the amount of warping at room temperature was 1 mm.

Example 8

[Specification of ACF]

The thickness t1 was 40 μm, the coefficient of linear expansion α1 was 80 ppm and the elastic modulus E1 was 4 GPa. Thus, the product α1×E1×t1 was 12800. The material of the insulating film was polyimide, the material of the conductive path was Cu, and others were the same as in Example 6.

[Specification of Inhibiting Layer]

The thickness t2 was 55 μm, the material was polyamide, the coefficient of linear expansion α2 was 80 ppm, the elastic modulus E2 was 2 GPa, and others were the same as in Example 6.

The product α2×E2×t2 was 8800, and the ratio (α1×E1×t1)/(α2×E2×t2) was about 1.5.

The method of forming an inhibiting layer and the junction method of ACF were the same as in Example 6. The wafer with ACF obtained was examined for warping. As a result, the wafer warped to the side of an arrow f1 in FIG. 8 and the amount of warping at room temperature was 0.5 mm.

Comparative Example 3

[Specification of ACF]

The thickness t1 was 70 μm, the coefficient of linear expansion α1 was 70 ppm and the elastic modulus E1 was 3.5 GPa. Thus, the product α1×E1×t1 was 17150. The material of the insulating film was polyamide, the material of the conductive path was Cu, and others were the same as in Example 6

[Specification of Inhibiting Layer]

The thickness t2 was 40 μm, the material was epoxy resin, the coefficient of linear expansion α2 was 50 ppm, the elastic modulus E2 was 3.5 GPa, and others were the same as in Example 6.

The product α2×E2×t2 was 7000, and the ratio (α1×E1×t1)/(α2×E2×t2) was about 2.45.

The method of forming an inhibiting layer and the junction method of ACF were the same as in Example 6. The wafer with ACF obtained was examined for warping. As a result, the wafer warped to the side of an arrow f1 in FIG. 8 and the amount of warping at room temperature was 5 mm.

As is evident from Examples 6–8 and Comparative Example 3, it has been found that, by determining the thickness, coefficient of linear expansion and elastic modulus of the inhibiting layer appropriately and applying the layer to a semiconductor wafer relative to ACF, warping can be effectively inhibited.

INDUSTRIAL APPLICABILITY

According to the production method of the present invention, an ACF—semiconductor wafer joined product can be produced efficiently, while retaining fine quality. As a result of the enabled mass production of joining ACF with semiconductor wafer, the connection process of the two can be simplified. This as an effect that bare chip mounting to connect a bare semiconductor element to a circuit pattern is expected to become popular and the assembly cost can be decreased.

By forming an inhibiting layer on the rear face of a semiconductor wafer, moreover, an ACF—semiconductor wafer joined product can be provided in a structure free of warping, whereby warping-related problems during dicing and the like can be eliminated.

This application is based on application Nos. 258059/1999 and 285150 both filed in Japan, the contents of which are incorporated hereinto by reference.

What is claimed is:

1. A method for producing a semiconductor wafer with an anisotropic conductive film, which method comprises the steps of sandwiching and depressurizably surrounding a laminate of an anisotropic conductive film on a circuit face of a semiconductor wafer, with flexible films or with a flexible film and a rigid plate in the laminating direction, depressurizing the surrounded interior, joining the semiconductor wafer and the anisotropic conductive film by pressurization of the laminate at least in the laminating direction and heating as is from the outside, first releasing the pressurization from the outside, and then lowering the temperature.

2. The production method of claim 1, wherein said anisotropic conductive film has a structure comprising a plurality of metal conductor wires as conductive paths, which are insulated from each other, and which penetrate a film substrate made of an insulating resin in the thickness direction thereof, and wherein the insulating resin to be used for the film substrate is a material that acquires adhesion property by heating.

3. The production method of claim 2, wherein the conductive path of said anisotropic conductive film has a solder layer on at least one end of the both ends thereof.

4. The production method of claim 1, wherein said laminate is sandwiched with flexible films or with a flexible film and a rigid plate in the laminating direction, via a release layer.

5. The production method of claim 4, wherein the release layer has a thickness of 25 μm–250 μm.

6. The production method of claim 1 or 4, wherein said laminate is sandwiched in the laminating direction with a flexible film and a rigid plate, and a cushion layer is inserted between the laminate and the rigid plate.

7. A semiconductor wafer with an anisotropic conductive film, comprising an anisotropic conductive film joined on a circuit face of the semiconductor wafer, and an inhibiting layer on a rear face of the semiconductor wafer, which layer causes an expansion-shrinkage force due to the temperature change by antagonizing an expansion-shrinkage force generated on the anisotropic conductive film due to temperature changes such that the entire film is kept from warping.

8. The semiconductor wafer with an anisotropic conductive film of claim 7, wherein said anisotropic conductive film has a structure comprising a plurarity of metal conductor wires as conductive paths, which are insulated from each other, and which penetrate a film substrate made of an insulating resin in the thickness direction thereof, and wherein the insulating resin to be used for the film substrate is a material that acquires adhesion property by heating.

9. The semiconductor wafer with an anisotropic conductive film of claim 8, wherein the conductive path of said anisotropic conductive film has a solder layer on at least an outer end of the both ends thereof.

10. The semiconductor wafer with an anisotropic conductive film of claim 7, wherein said inhibiting layer is made from an organic polymer material.

11. The semiconductor wafer with an anisotropic conductive film of claim 7, wherein said anisotropic conductive film has a ($\alpha 1 \times E1 \times t1$)/($\alpha 2 \times E2 \times t2$) ratio of a product ($\alpha 1 \times E1 \times t1$) of (a coefficient of linear expansion $\alpha 1$, an elastic modulus E1 and a thickness t1) of said anisotropic conductive film to a product ($\alpha 2 \times E2 \times t2$) of (a coefficient of linear expansion $\alpha 2$, an elastic modulus E2 and a thickness t2) of said inhibiting layer of 0.5–2.0.

12. The semiconductor wafer with an anisotropic conductive film of claim 7, wherein said inhibiting layer comprises a coloring agent.

13. A method for producing a semiconductor wafer with an anisotropic conductive film of any of claims 7 to 12, which method comprises the steps of superimposing an anisotropic conductive film on a circuit face of a semiconductor wafer, superimposing an inhibiting layer on a rear face of the semiconductor wafer, which layer causes an expansion-shrinkage force due to the temperature change by antagonizing an expansion-shrinkage force generated on the anisotropic conductive film due to temperature changes such that the entire film is kept from warping, and joining these successively or simultaneously with a semiconductor wafer by heating and/or pressurizing such that respective expansion-shrinkage forces antagonize with each other to inhibit warping.

14. The production method of claim 13, which method comprises the steps of superimposing an anisotropic conductive film on a circuit face of a semiconductor wafer, superimposing an inhibiting layer on the rear face of the semiconductor wafer, sandwiching and depressurizably surrounding this with flexible films or with a flexible film and a rigid plate in the laminating direction, depressurizing the surrounded interior, and pressurizing the surrounded interior at least in the laminating direction and heating the surrounded interior as is from the outside, to join the semiconductor wafer with the anisotropic conductive film and the semiconductor wafer with the inhibiting layer.

\* \* \* \* \*

UNITED STATES PATENT AND TRADEMARK OFFICE
CERTIFICATE OF CORRECTION

PATENT NO. : 6,613,608 B1  
DATED : September 2, 2003  
INVENTOR(S) : Miho Yamaguchi, Yuji Hotta and Fumiteru Asai It is certified that error appears in the above-identified patent and that said Letters Patent is hereby corrected as shown below:

<u>Title page,</u>  
Item [86], § 371 (c) (1), (2), (4) Date: delete "Jul. 12, 2000" insert -- Jul. 12, 2002 --

Signed and Sealed this

Third Day of August, 2004

JON W. DUDAS  
*Acting Director of the United States Patent and Trademark Office*